United States Patent
Kerstein et al.

Patent Number: 6,111,875
Date of Patent: Aug. 29, 2000

[54] APPARATUS AND METHOD FOR DISABLING EXTERNAL FRAME FORWARDING DEVICE FOR USE WITH A NETWORK SWITCH

[75] Inventors: Denise Kerstein, Palo Alto; Chandan Egbert, San Jose; Bahadir Erimli, Mountain View; Thomas J. Runaldue, San Jose, all of Calif.

[73] Assignee: Advanced Micro Devices, Inc., Sunnyvale, Calif.

[21] Appl. No.: 08/993,144

[22] Filed: Dec. 18, 1997

Related U.S. Application Data

[60] Provisional application No. 60/038,025, Feb. 14, 1997.

[51] Int. Cl.$^7$ .............................. H04L 12/28; H04L 12/56
[52] U.S. Cl. ............................................ 370/389; 370/422
[58] Field of Search ..................... 370/351, 352, 370/389, 392, 401, 402, 422, 426, 427, 428

[56] References Cited

U.S. PATENT DOCUMENTS

| | | |
|---|---|---|
| 5,305,321 | 4/1994 | Crayford . |
| 5,430,726 | 7/1995 | Moorwood et al. ..................... 370/438 |
| 5,515,376 | 5/1996 | Murthy et al. . |
| 5,793,822 | 8/1998 | Anderson et al. ....................... 375/371 |
| 5,978,383 | 11/1999 | Molle ...................................... 370/445 |

*Primary Examiner*—Douglas W. Olms
*Assistant Examiner*—David R Vincent

[57] ABSTRACT

An interface device enables an external device connected to a network switch to be disabled. The interface device receives and transmits data to an external device which makes data forwarding decisions. When a disable signal is received by the network switch, the disable signal is transmitted to the external device over an existing data path. The external device returns an acknowledgement signal over an existing path to the switch. A timer is included as a failsafe mechanism in case the external device does not return an acknowledge signal. The timer waits a predetermined period of time and continues the shut down of the network switch as if the acknowledge signal was received.

15 Claims, 7 Drawing Sheets

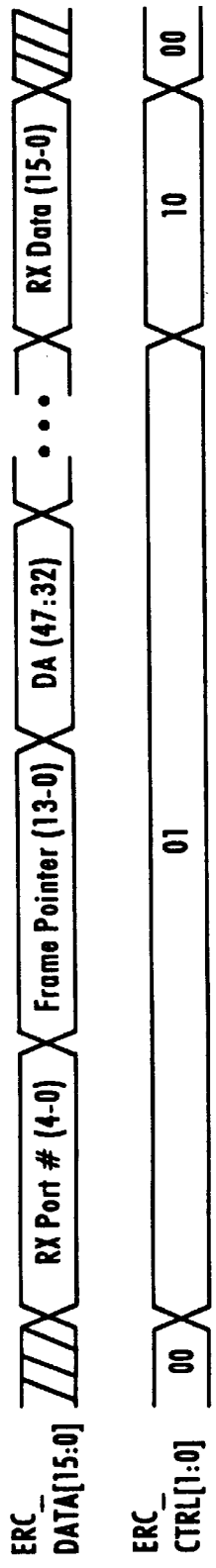
Fig. 4 ERC_DATA and ERC_CTRL Transfer to ERC
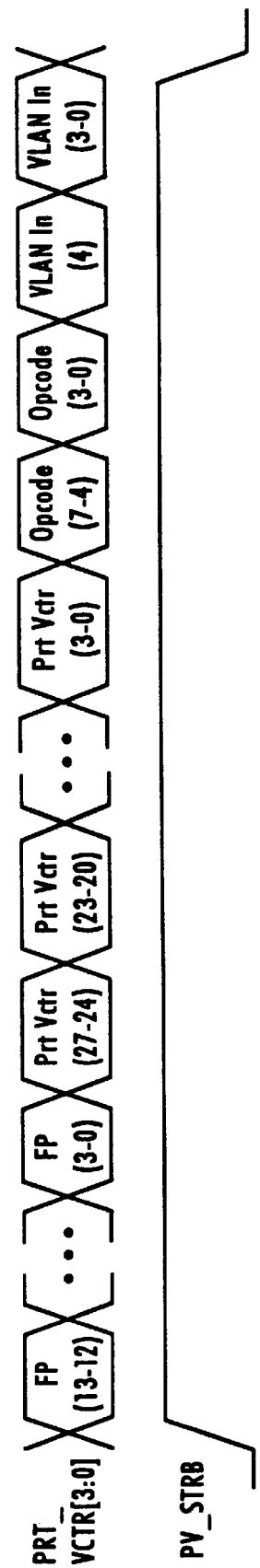
Fig. 6 PRT_VCTR and PV_STRB Transfer from ERC

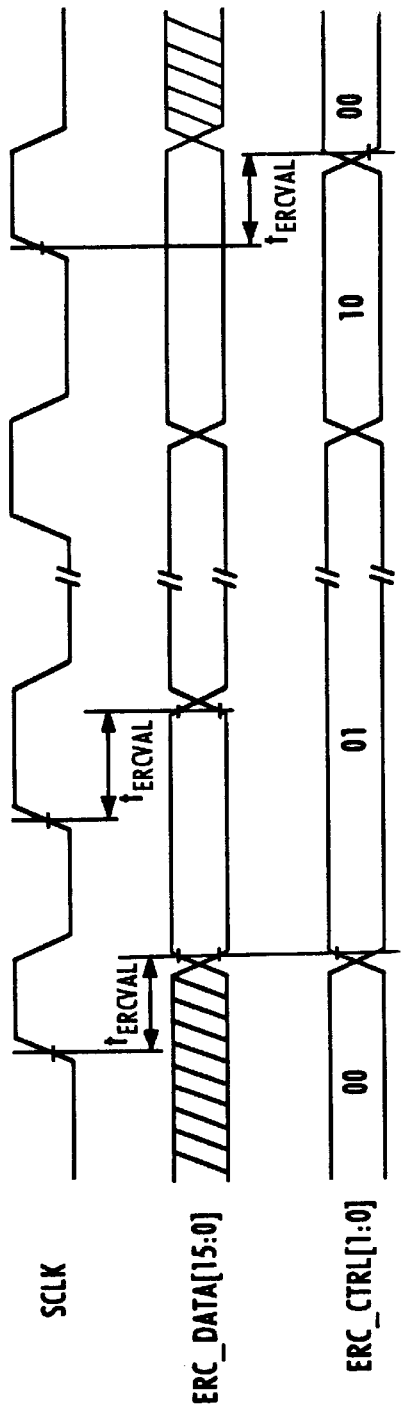
Fig. 5  ERCI Data Timings
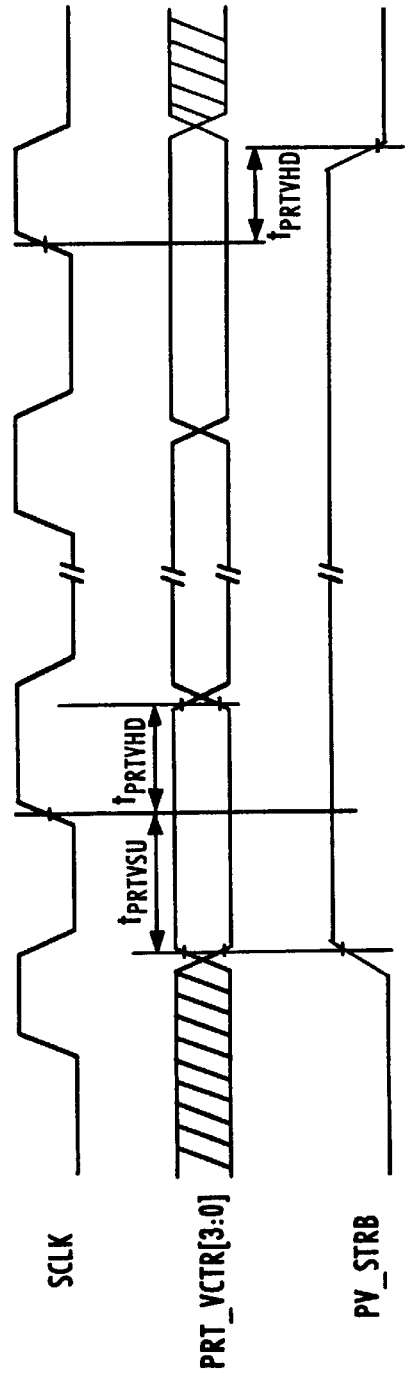
Fig. 7  ERCI Port Vector Timings

APPARATUS AND METHOD FOR DISABLING EXTERNAL FRAME FORWARDING DEVICE FOR USE WITH A NETWORK SWITCH

CROSS-REFERENCE TO RELATED APPLICATIONS

This application claims priority from provisional patent application Ser. No. 60/038,025, filed Feb. 14, 1997, entitled INTEGRATED MULTIPORT SWITCH, which is incorporated herein by reference.

This application is related to commonly-assigned, copending application Ser. No. 08/993,715, filed Dec. 18, 1997, filed concurrently herewith, entitled EXTERNAL RULES CHECKER INTERFACE and commonly-assigned, copending application Ser. No. 08/993,047, filed Dec. 18, 1997, filed concurrently herewith, entitled METHOD AND APPARATUS FOR RESETTING, ENABLING AND FREEZING DEVICE IN A DIAGNOSTIC PROCESS.

TECHNICAL FIELD

This invention relates to network communications and more particularly to disabling an external device connected to a network switch.

BACKGROUND ART

In computer networks, a plurality of network stations are interconnected via a communications medium. For example, Ethernet is a commonly used local area network scheme in which multiple stations are connected to a single shared serial data path. These stations typically communicate with a network switch located between the shared data path and the stations connected to that path. Typically, the switch controls the communication of data packets on the network.

When all of the stations connected to the network are simultaneously operating, packet traffic on the shared serial path can be heavy with thousands of packets flowing through the switch. In many prior art systems, when a problem occurs in the switch or network, the system is merely reset and the data packets being processed by the switch are lost. Troubleshooting what caused the problem is very difficult in such systems since the state of the switch at the time of the failure is not preserved.

SUMMARY OF THE INVENTION

There exists a need for a network switch that can suspend operation while maintaining the state of the switch.

There is also a need for suspending operation of an external device, that communicates with a network switch and may change the state of the network switch, without requiring additional hardware to accomplish the disabling.

These and other needs are met by the present invention, where a disable signal transmitted to a network switch is forwarded to an external device over an existing data path in order to preserve the state of the switch. The external device may generate data forwarding information before the disable signal is received.

According to one aspect of the present invention, a method is provided for disabling an external device. The method includes receiving a disable signal from a host device, routing the disable signal through the multiport switch and transmitting a second signal to the external device. The second signal represents a disable signal and functions to suspend operation of the external device.

Another aspect of the present invention provides an interface located on a network switch to disable the external device. The interface device includes an input that receives frame data and control information from the switch. The interface device also includes an output that is used to transmit a second signal to the external device, where the second signal indicates that the external device is to be disabled. The interface device further includes a second input for receiving data from the external device, where the second input receives an acknowledgement that the second signal was received.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

FIGS. 2, 2A and 2B are block diagrams of a multiport switch constructed in accordance with an embodiment of the present invention and used in the packet switched system of FIG. 1.

FIG. 4 illustrates the data transmitted to the external rules checker via the external rules checker interface.

FIG. 5 illustrates the timing of the data transfer of FIG. 4.

FIG. 6 illustrates the data transmitted from the external rules checker to the external rules checker interface.

FIG. 7 illustrates timing of the data transfer of FIG. 6.

DETAILED DESCRIPTION OF THE INVENTION

The present invention will be described with the example of a switch in a packet switched network, such as an Ethernet (IEEE 802.3) network. A description will first be given of the switch architecture, followed by a detailed description of the arrangement for disabling the external rules checker. It will become apparent, however, that the present invention is also applicable to other packet switched systems, as described in detail below.

SWITCH ARCHITECTURE

Figure 1:
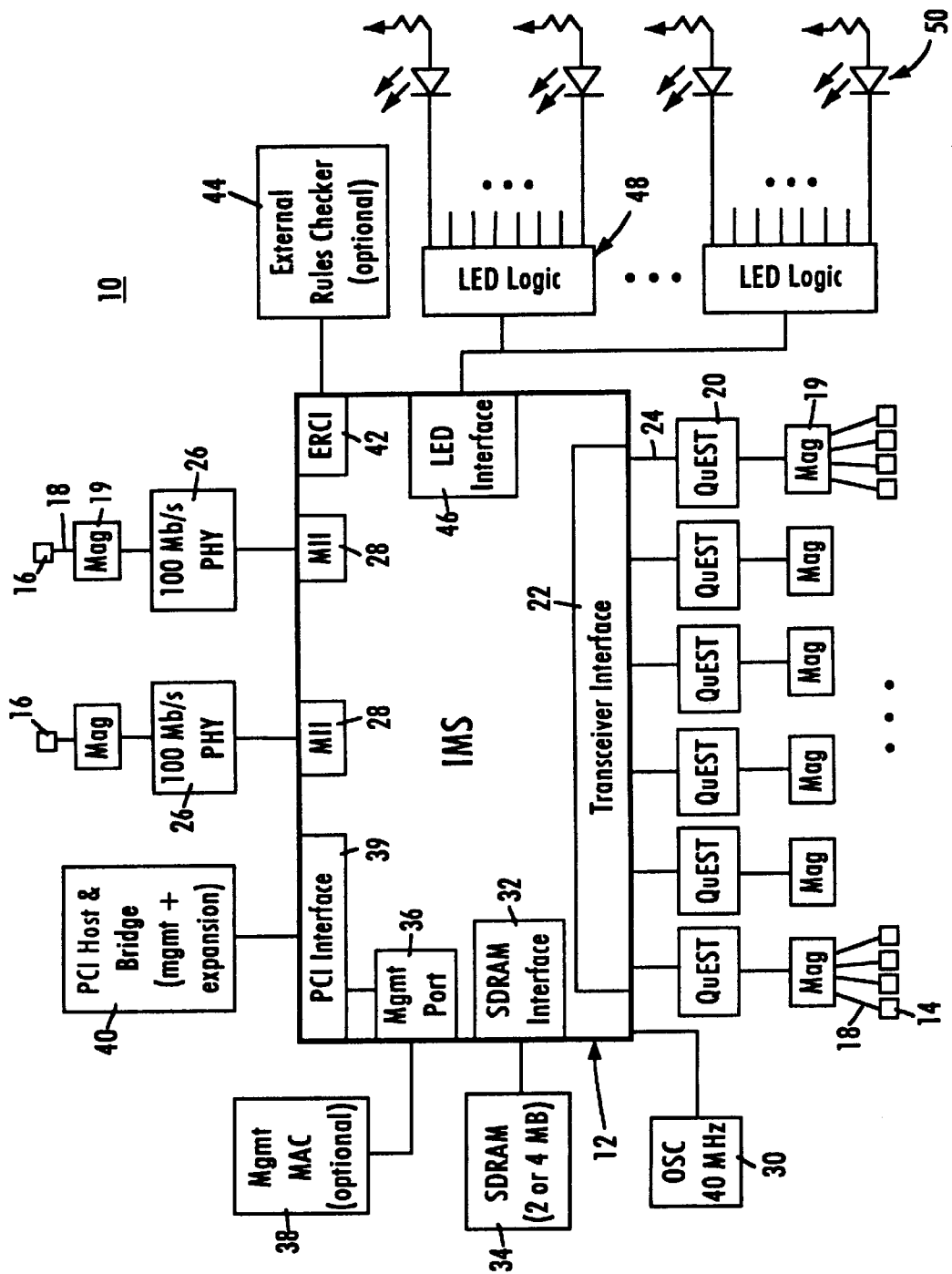
FIG. 1 is a block diagram of a packet switched system in which the present invention may be utilized.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a peripheral component interconnect (PCI) interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The multiport switch 12 includes an external rules checker interface (ERCI) 42 that allows an external rules checker (ERC) 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2A:
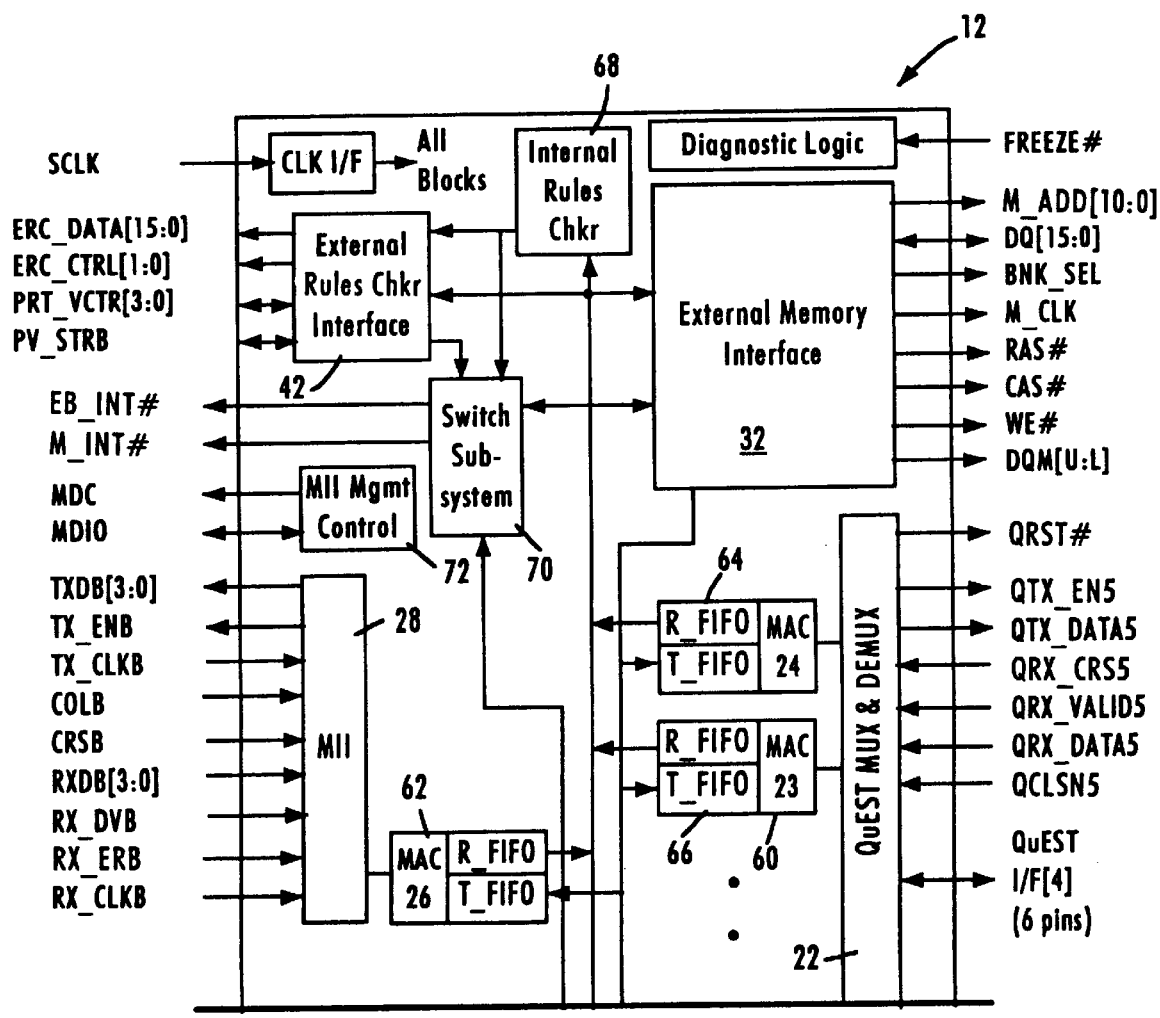
Figure 2B:
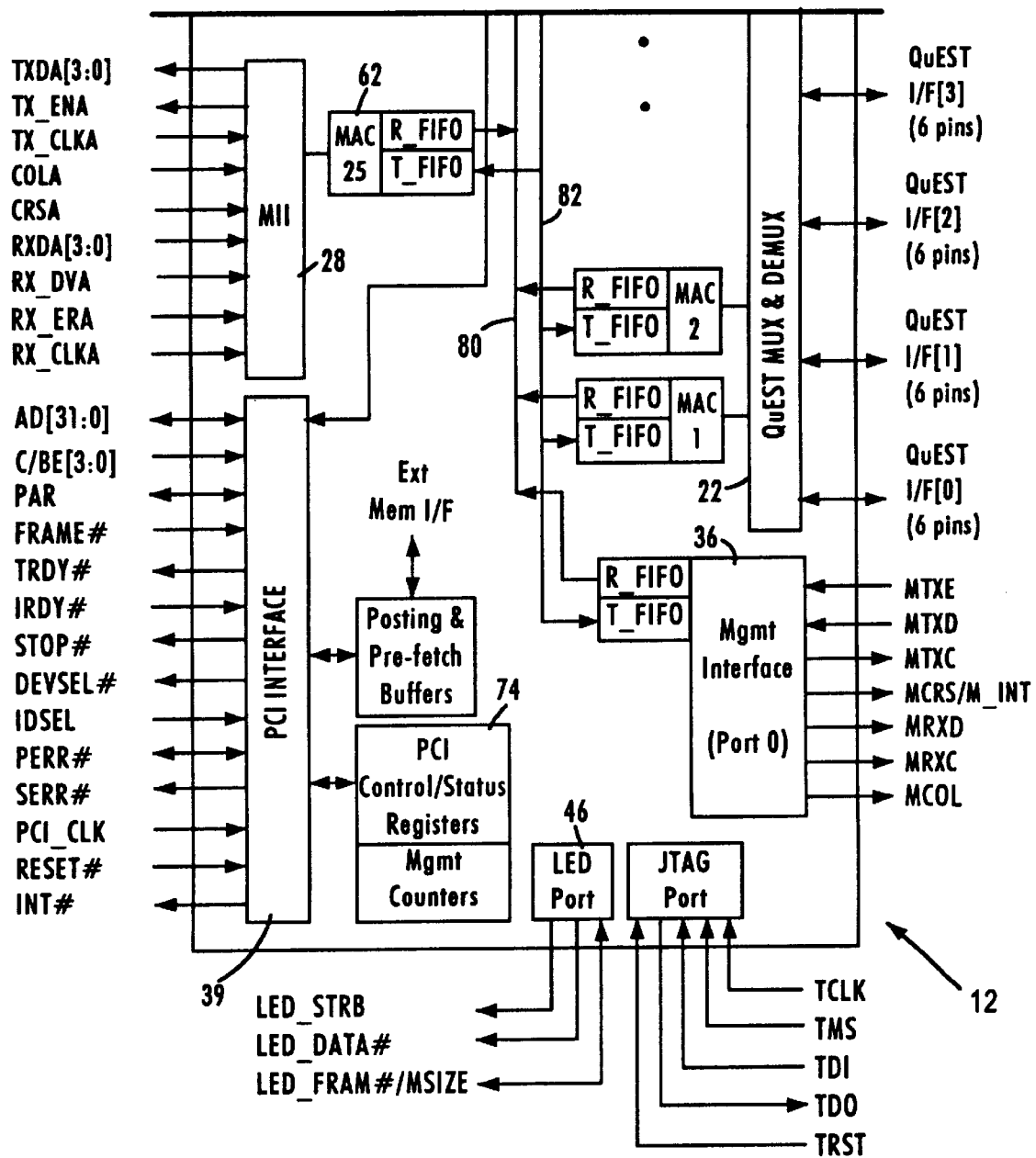

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
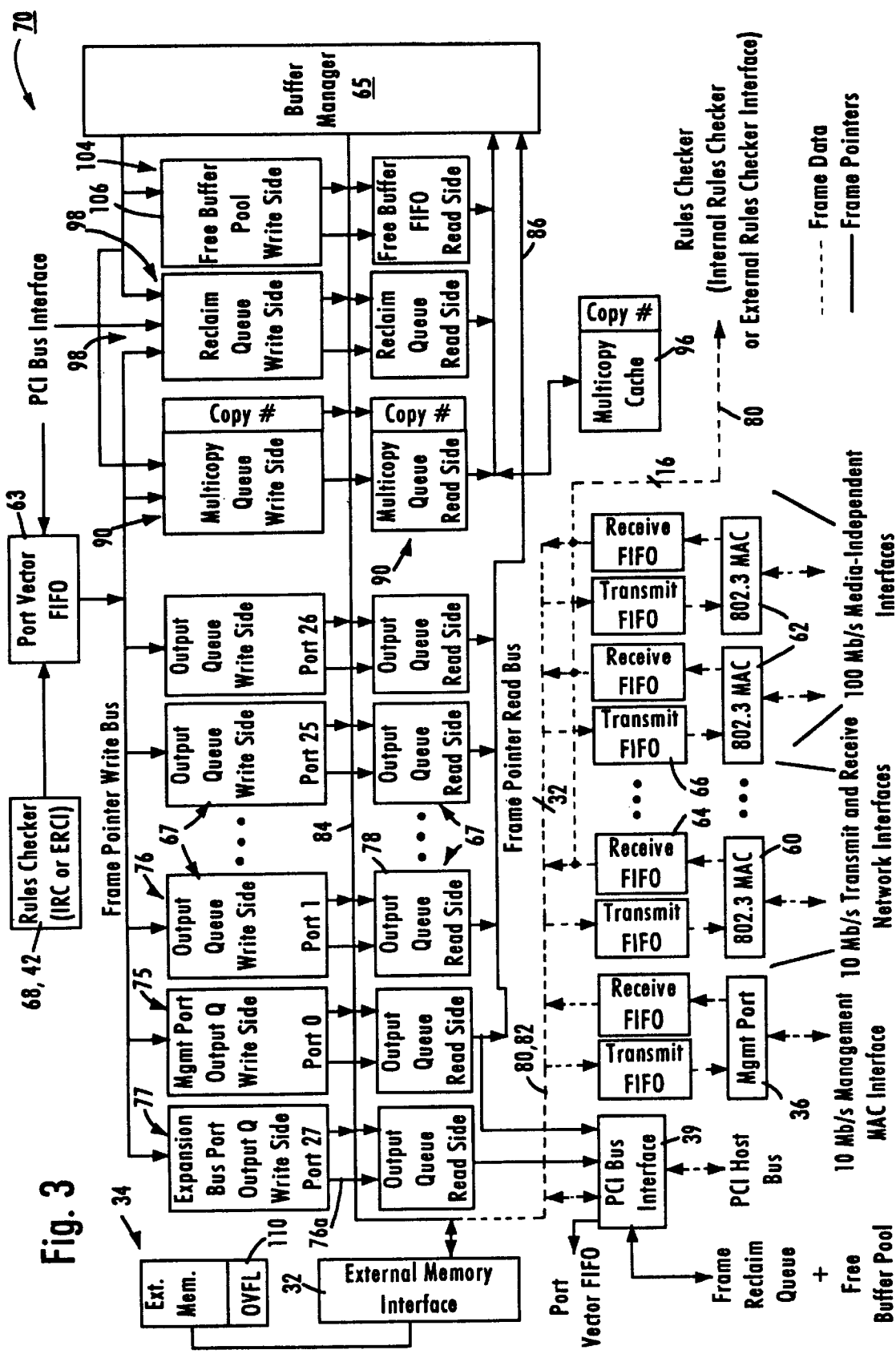
FIG. 3 is a detailed block diagram of the switch subsystem of FIG. 2.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header of the received packet is also forwarded to a decision making engine to determine which MAC ports will output the data packet. The multiport switch 12 supports two decision making engines, an internal rules checker (IRC) 68 and an external rules checker (ERC) 44. In order for the ERC 44 to function, the multiport switch 12 sends data to the ERC 44 via the external rules checker interface (ERCI) 42. The ERCI 42 is enabled and disabled via a rules checker configuration register 74 located on the multiport switch 12. The IRC 68 and ERCI 42 do not operate simultaneously. The IRC 68 and ERC 44 provide the decision making logic for determining the destination MAC port for a given data packet. The decision making engine may determine that a given data packet is transmitted to either a single port, multiple ports, or all ports (i.e., broadcast).

As described above, the multiport switch 12 provides the switching logic for receiving and forwarding frames to the appropriate output ports. The frame forwarding decisions however, are made by the rules checker, either the IRC 68 or the ERC 44. The rules checker contains a set of addresses along with VLAN associations and forwarding port vectors. When a port on multiport switch 12 receives a frame, it sends a frame pointer (location in external memory 34 where the frame is stored), the receive port number, destination address (DA) and source address (SA) to the rules checker. If the IRC 68 is enabled, the port also forwards hash keys and VLAN ID (if applicable). The rules checker searches its address table for the appropriate addresses and makes a forwarding decision based upon the SA, receive port, DA and VLAN associations. It then forwards the frame pointer, a forwarding port vector, the VLAN index (if appropriate) and a control opcode to the port vector FIFO 63 (See FIG. 3).

The IRC 68 provides logic to support 512 user addresses and capabilities for 32 unique VLANs. The ERC 44 via the ERCI 42 supports a much larger number of addresses, VLANs and routing functions. In the exemplary embodiment, the ERC 44 supports over 8000 addresses. The logic for the ERC 44 and IRC 68 function in the same manner. The discussion below assumes that the ERCI 42 is enabled.

The rules checker configuration register 74 which enables the ERCI 42, also programs the number of bytes of data forwarded to the ERC 44, described in detail below.

The ERCI 42 is sized to support communication with all of the ports on multiport switch 12. Specifically, the ERCI 42 is sized so that when all of the ports on the network are simultaneously active, the ERCI 42 transmits header information from each packet to the ERC 44. The ERC 44 makes its forwarding decision and transmits the decision back to the multiport switch 12, via the ERCI 42, before the packet must be forwarded. However, there is no restriction on the length of time required for the ERC 44 to make the forwarding decisions, such as to make the decisions before the frame is completely buffered to external memory. There is also no requirement to make forwarding decisions in the same order as frames are received. For example, the ERC 44 may make a decision for some packets based on the DA and SA. For other packets, the ERC 44 may look at the packet data and determine that the packet contains data which has a higher priority, for example, the data may be multicast data which is being sent to all the stations. In this situation, the ERC 44 may prioritize this multicast data and send forwarding information to the ERCI 42 before lower-priority data which was received earlier. Further, the ERC 44 may push the multicast data out more quickly than for standard data using a hardware assist or other procedure to enable the data to be transmitted back to the multiport switch more quickly than for normal data packets.

With reference to FIG. 4, the ERCI 42 forwards data to the ERC on a 16-bit ERC data bus, ERC DATA [15:0], synchronous to the system clock, SCLK. In the exemplary embodiment, SCLK is a 40 MHz oscillator shared by the multiport switch 12 and switch transceivers 20. The ERCI 42 transmits a 5-bit receive port number on ERC DATA [4:0], the frame pointer on ERC DATA [13:0] and a programmed number of bytes of the received frame. The data after frame pointer in FIG. 4 is the programmable bytes of data. The frame pointer is the address in external memory 34 where the frame is stored. The ERCI 42 transmits a maximum of 64 bytes of the received frame and the actual number of bytes transmitted is programmed in the rules checker configuration register 74. At a minimum, the ERCI 42 transmits the receive port, destination address (DA), source address (SA) and the frame pointer. In situations where the ERCI 42 transmits an odd number of bytes to the ERC 44, ERC DATA [7:0] is the active byte lane on the last transfer.

The ERCI 42 also outputs control data on a 2-bit ERC control bus, ERC CTRL. The ERC control signal indicates when ERC data is active. For example, ERC CTRL bits "00" indicate that the ERC DATA is idle, "01" indicate that both bytes on ERC DATA are active, and "10" indicate that this the current transfer is the last transfer and one or both bytes on ERC DATA are active. FIG. 5 shows a data timing diagram of ERC DATA [15:0] and ERC CTRL [1:0].

The ERC 44 receives the data from ERCI 42 and searches its address table for the appropriate addresses and makes a forwarding decision based upon the received data. With reference to FIG. 6, the ERC 44 sends a frame pointer (14 bits), the forwarding Port Vector (28 bits), the Control Opcode (8 bits) and the VLAN Index (5 bits) on a four bit port vector bus, PRT VCTR [3:0]. The ERCI 42 transmits the data on PRT VCTR [3: 0], synchronous to SCLK, to the switch subsystem 70. ERC 44 pads the fields to 16 bits for the frame pointer, 28 bits for the Port Vector, 8 bits for the VLAN Index and 8 bits for the Control Opcode. A frame signal, port vector strobe, PV STRB, indicates when data is valid on PRT VCTR [3:0]. For diagnostic purposes, the multiport switch 12 can be monitored on port vector, PRT VCTR or PV STRB. FIG. 7 shows a timing diagram of the port vector bus and port vector strobe signal in relation to SCLK.

The ERCI 42 outputs the forwarding decision to switch subsystem 70. The switch subsystem 70 fetches the data packet identified in the port vector from the external memory 34 via the external memory interface 32, and supplies the retrieved data packet to the appropriate transmit FIFO 66 of the identified ports. The switch subsystem may send a given data packet to either a single port, multiple ports, or all ports (i.e., broadcast) based on the output from ERC 44. For example, the received data packet may include a destination address that identifies a plurality of network stations. Alternatively, the received packet may include a VLAN (virtual LAN) tagged frame according to IEEE 802.1d protocol that specifies another network (via a router at one of the 100 Mb/s stations 16) or a prescribed group of stations. Hence, the ERC 44 via the ERCI 42 decides whether a frame temporarily stored in the buffer memory 34 should be output to a single MAC or multiple MAC ports.

As described above, the ERC 44, based on the information in the header, determines from where the frame packet will be transmitted. The description below assumes that either the IRC 68 or ERC 44 is operating.

At the same time as the rules checker, 44 or 68, is making a forwarding determination, the buffer manager 65 obtains a free frame pointer from the free buffer pool 104. The free frame pointer specifies a location in external memory 34 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 44 or 68. Hence, the rules checker uses the port vector to assign the frame pointer to at least one destination port.

The rules checker, 44 or 68, places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

DISABLING EXTERNAL RULES CHECKER

The present invention is directed to disabling the external rules checker 44 (ERC) via the external rules checker interface (ERCI) 42. The multiport switch 12 includes a cascaded shutdown mode enabling activity to be halted on the multiport switch 12 without losing data.

The multiport switch 12 may need to be disabled for diagnostic purposes. In order to diagnose the multiport switch 12 at any particular time, the PCI host 40 (FIG. 1) outputs a disable signal to the multiport switch 12 to freeze the present state of the multiport switch 12 so that the internal registers of the switch can be analyzed. The disable signal is cascaded through the multiport switch 12 to shut down operation of the multiport switch 12.

Figure 8:
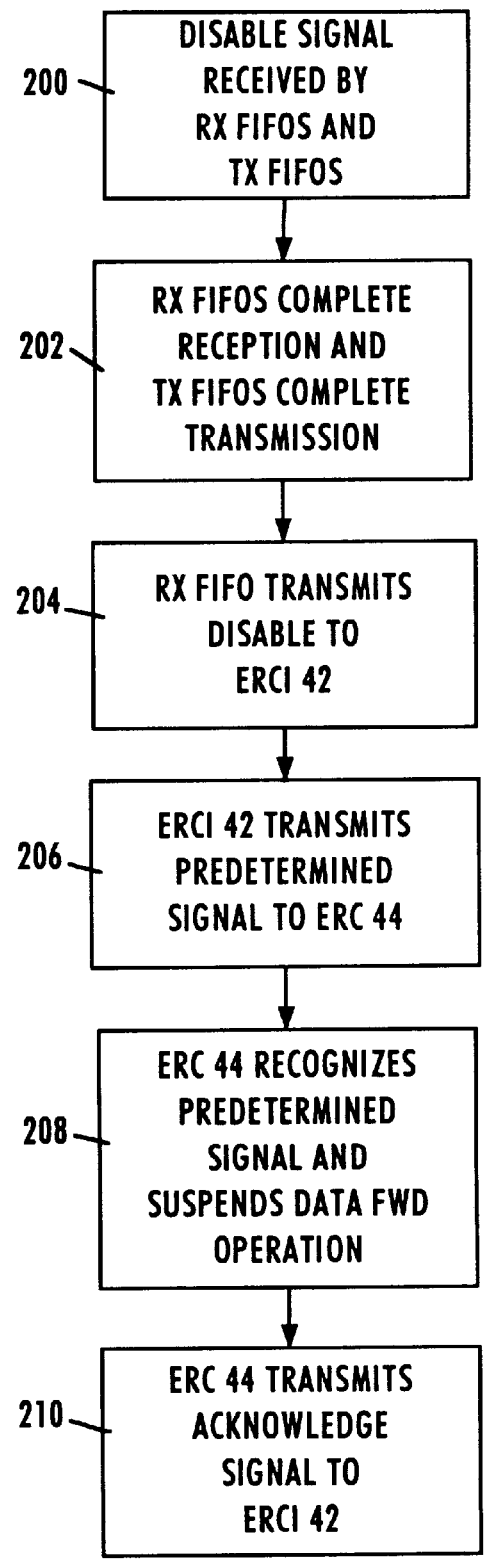
FIG. 8 is diagram illustrating the method for disabling the external rules checker according to an embodiment of the present invention.

FIG. 8 is flow diagram illustrating the method for disabling the ERC 44 in accordance with an embodiment of the invention. Each device on multiport switch 12 receives the disable signal in a predetermined order. Specifically, the order that the disable signal is routed between the devices is the same order that data flows through the switch when the multiport switch 12 is operating. The multiport switch 12 receives the disable signal (typically over the PCI interface). The receive FIFOs and transmit FIFOs receive the disable signal in step 200. Each receive FIFO completes receiving any packet being received at the time the disable is received and each transmit FIFO completes transmitting all packets in the transmit FIFO at the time the disable signal is received (step 202). The transmit FIFOs stop processing after the last buffer is placed in the Free Buffer List for unicast data or the last frame pointer is sent to the multicopy queues for multicast data. An MIB report is sent to the MIB unit.

Hence, the receive FIFO completes receiving any packet currently being received. The receive FIFOs may request new buffers from the Free list and send an MIB report to the MIB unit after the receive FIFOs stop processing. The receive FIFOs accept no new data packets. All data in the FIFOs is transferred to the SDRAM. The receive FIFOs stop after the frame header of the packet that was being received is updated. The multiport switch 12 completes any current memory transfer and stops processing after all receive and transmit FIFOs stop. The last receive FIFO processing then passes a disable signal to the rules checker, either the IRC 68 or the ERC 44. The description below assumes that the ERCI 42 is enabled and that the rules checker being used is the ERC 44.

In order for the state of the multiport switch 12 to be preserved for diagnostic purposes, the data packet forwarding logic within the ERC 44 must be disabled in order to preserve the state of the chip at the time the disable signal is received. This is due to the fact that if the data packet forwarding logic within the ERC 44 is not disabled, the ERC 44 continues sending data to the multiport switch 12, thereby changing the state of various registers and buffers on the multiport switch 12. Alternatively, all operations within the ERC 44 may be suspended.

As discussed above, the receive FIFOs complete receiving any packet currently being received. Upon completion, the receive FIFO passes a disable signal to the ERCI 42 in step 204. The ERCI 42 receives the disable signal and sends a predetermined signal indicating an illegal or prohibited operation to the ERC 44 over ERC DATA in step 206. In the exemplary embodiment, the predetermined signal is frame pointer consisting of all zeros, a null frame pointer. The ERC 44 recognizes the null frame pointer as an illegal frame pointer and suspends its operation in step 208. That is, the ERC 44 stops sending data forwarding information to the ERCI 42. Alternatively, any other predetermined signal not utilized by the network switch could be used to communicate the disable signal.

The ERC 44 acknowledges the receipt of the null frame pointer and passes an acknowledge signal in step 210 to the ERCI 42 so that the disabling of the multiport switch 12 continues. In the exemplary embodiment, the ERC 44 sends a null frame pointer to ERCI 42 on PRT VCTR. Alternatively, any other predetermined signal indicating an illegal or prohibited operation could be used to communicate the acknowledgement. This null frame pointer passes to the port vector FIFO to allow the multiport switch 12 to continue its shut down process. The ERCI 42 transmits and receives the null frame pointer over an existing data path, ERC DATA. Using this existing path between the ERCI 42 and the ERC 44 to communicate the disable signal, results in a savings of two pins on the multiport switch 12, one for sending a disable signal and one for receiving the acknowledgement signal. In situations where input/output pins are at a premium, this use of existing pins to disable the ERC 44 results in a considerable advantage.

As discussed above, the disable signal is routed through the multiport switch 12 in the same order that data is routed through the multiport switch 12. In situations where the ERC 44 is unable to respond to the disable signal, the devices located downstream of the ERC 44 (port vector FIFO, output queues, multicopy queue, multicopy cache, etc.) continue operating since the disable signal has not been returned to the multiport switch 12.

The present invention includes a failsafe mechanism for shutting down the multiport switch 12 when the ERC 44 is unable to return the disable signal to ERCI 42 for any reason. When the ERCI sends the null frame pointer to the ERC 44, the multiport switch starts a timer. If ERC 44 does not send back an acknowledgment of the disable signal to the ERCI 42, in the form of a null frame pointer, within a predetermined period of time, the timer times out and the disable process continues as if the null frame pointer was received. The timeout timer period is user programmable. This enables the multiport switch 12 to continue the shut down procedure in the event that the ERC 44 is unable to return the null frame pointer.

Described has been a system and method for disabling an external device which receives and sends data to a network switch. An advantage of the invention is that the state of the switch is preserved, allowing troubleshooting of the problem. Another advantage of the invention is that the external device is disabled via an existing data path, thereby resulting in a pin savings of two I/O pins. A further advantage of the invention is that the switch saves the current state at the time of the disabling, allowing the switch to be restarted without losing the data being transmitted at the time of the disable signal. Additionally, the state of the ERC 44 may also be preserved.

In this disclosure, there is shown and described only the preferred embodiments of the invention, but, as aforementioned, it to be understood that the invention is capable of use in various other combinations and environments and is capable of changes or modifications within the scope of the inventive concept as expressed herein.

What is claimed is:

1. In a multiport switch that controls the transmission of data packets between stations in a network, a method of disabling an external device that communicates with the multiport switch, comprising the steps of:

a) receiving a disable signal from a host device;

b) transmitting a second signal from the multiport switch to the external device for suspending operation of the external device; and c) routing the disable signal through the multiport switch based on the suspended operation of the external device.

2. The method of claim 1, wherein step c) further comprises:

transmitting the second signal over an existing data path to the external device.

3. The method of claim 1, further comprising the step of:

receiving an acknowledgment signal from the external device indicating that the second signal was received by the external device.

4. The method of claim 1, wherein the second signal represents an illegal or prohibited operation.

5. The method of claim 1, wherein the second signal comprises:

an address that is not used by the network switch.

6. The method of claim 1, wherein the second signal comprises:

a null frame pointer having a prescribed pattern.

7. The method of claim 1, further comprising:

starting a timer when the second signal is transmitted, wherein if an acknowledgment signal is not received within a predetermined time, the multiport switch continues processing as if the acknowledgement signal was received.

8. In a multiport switch that controls the transmission of data packets between stations in a network, an interface device comprising:

an input for receiving frame data and control information, wherein the control information comprises a disable signal;

an output for transmitting frame data and a second signal to an external device, the second signal indicating that the operation of data packet forwarding logic within the external device is to be suspended; and a second input for receiving data forwarding information and an acknowledgment of the second signal from the external device.

9. The interface device of claim 8, wherein the second signal represents an illegal or prohibited operation.

10. The interface device of claim 8, wherein the second signal comprises:

an address that is not used by the network switch.

11. The interface device of claim 8, wherein the second signal comprises:

a predetermined frame pointer operative for disabling the external device.

12. The interface device of claim 1, further comprising:

a timer, wherein the timer begins counting when the second signal is transmitted, wherein if the acknowledgment signal is not received within a predetermined time, the multiport switch continues processing as if the acknowledgement signal was received.

13. In an integrated switch which enables and controls communication of data packets between network stations, a method of disabling an external device comprising the steps of:

a) receiving a disable signal;

b) transmitting the disable signal over an existing data path to the external device;

c) suspending operation of data packet forwarding logic within the external device; and d) transmitting an acknowledgement signal to the switch.

14. The method of claim 13, wherein step b) further comprises:

passing a null frame pointer to the external device.

15. The method of claim 13, wherein step d) further comprises:

passing a null frame pointer to the switch.

* * * * *